United States Patent
Jeong

(10) Patent No.: US 9,379,715 B2
(45) Date of Patent: Jun. 28, 2016

(54) SEMICONDUCTOR APPARATUS AND SYSTEM INCLUDING PLURALITY OF CHANNELS

(71) Applicant: SK hynix Inc., Gyeonggi-do (KR)

(72) Inventor: Chun Seok Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/521,163

(22) Filed: Oct. 22, 2014

(65) Prior Publication Data

US 2016/0028407 A1     Jan. 28, 2016

(30) Foreign Application Priority Data

Jul. 24, 2014   (KR) ................. 10-2014-0094132

(51) Int. Cl.
*H03L 7/00* (2006.01)
(52) U.S. Cl.
CPC ....................... *H03L 7/00* (2013.01)
(58) Field of Classification Search
CPC . G06F 13/4022; G06F 12/0862; G06F 13/28; G11C 2213/71; G11C 5/02; G11C 7/1006; G11C 29/54; H01L 2924/1434; H01L 2924/15192; H01L 23/481; H01L 24/05
USPC ............................................ 365/63, 129, 190
See application file for complete search history.

(56) References Cited

U.S. PATENT DOCUMENTS

| 7,051,225 B2 | 5/2006 | Nishio et al. | |
| 2013/0021079 A1* | 1/2013 | Jeong | H03K 5/135 327/286 |

FOREIGN PATENT DOCUMENTS

KR        101046273        7/2011

* cited by examiner

*Primary Examiner* — John Poos
(74) *Attorney, Agent, or Firm* — IP & T Group LLP

(57) ABSTRACT

A semiconductor apparatus includes a direct access section, an interface section, and a through-silicon via region. The direct access section receives a normal clock, a first clock, and a control signal through a direct access pad. The interface section comprises a plurality of channel circuits suitable for aligning the control signal to the first clock, and outputting an aligned control signal. The through-silicon via region transfers the normal clock and the aligned control signal from the interface section to a plurality of channels corresponding to the respective channel circuits.

18 Claims, 7 Drawing Sheets

SEMICONDUCTOR APPARATUS AND SYSTEM INCLUDING PLURALITY OF CHANNELS

CROSS-REFERENCES TO RELATED APPLICATION

The present application claims priority under 35 U.S.C. §119(a) to Korean application number 10-2014-0094132, filed on Jul. 24, 2014 in the Korean Intellectual Property Office, which is incorporated herein by reference in its entirety.

BACKGROUND

1. Technical Field

Various embodiments relate to a semiconductor apparatus, and more particularly to a semiconductor apparatus having a plurality of chips and a plurality of channels.

2. Related Art

In order to improve the degree of integration of a semiconductor apparatus, a 3-dimensional (3D) semiconductor apparatus is provided. The degree of integration of the 3D semiconductor apparatus is improved by stacking and packaging a plurality of chips in a single package. The 3D semiconductor apparatus has two or more vertically stacked chips and thus achieves a relatively high degree of integration in a limited space.

For a 3D semiconductor apparatus, a plurality of chips may be stacked and packaged in various ways. For example, a plurality of chips having the same structure may be stacked and coupled to each other through a wire, such as a metal Fine, to serve as a single semiconductor apparatus, Under a through silicon via (TSV) scheme, as another example, a plurality of chips may be stacked and electrically coupled to each other using a via passing therethrough. Since a TSV-implemented semiconductor apparatus couples stacked chips using a via passing therethrough, it may efficiently reduce its package area compared to a wire-implemented semiconductor apparatus using a wire disposed in the border area of the stacked chips.

Each of the plurality of chips of the semiconductor apparatus may have a channel. The plurality of channels may transfer different control signals and data from one another, and the plurality of chips may independently operate,

SUMMARY

In an embodiment of the present invention, a semiconductor apparatus may include a direct access section suitable for receiving a normal clock, a first clock, and a control signal through a direct access pad, an interface section comprising a plurality of channel circuits suitable for aligning the control signal to the first clock, and outputting an aligned control signal and a through-silicon via region suitable for transferring the normal clock and the aligned control signal from the interface section to a plurality of channels corresponding to the respective channel circuits.

In an embodiment of the present invention, a semiconductor apparatus may include a direct access section suitable for receiving a normal clock, a first clock, a second clock, and a control signal through a direct access pad, an interface section comprising a plurality of channel circuits suitable for aligning the control signal to one of the first clock and the second clock, and outputting an aligned control signal in response to a channel selection signal assigned thereto and a through-silicon via region suitable for transferring the normal clock and the aligned control signal from the interface section to a plurality of channels corresponding to the respective channel circuits.

In an embodiment of the present invention, a semiconductor apparatus may include a direct access section suitable for receiving first and second clocks having a phase difference from each other, and a control signal synchronized to the first clock, and an interface section comprising a plurality of channel circuits suitable for aligning the control signal to the second clock based on a plurality of channel selection signals, respectively, wherein the interface section transfers the first clock and an aligned control signal to a plurality of channels corresponding to the respective channel circuits through a through-silicon via region.

DETAILED DESCRIPTION

Figure 1:
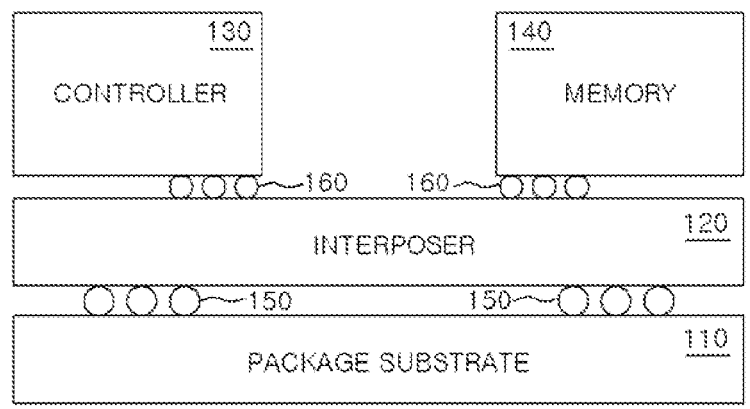
FIG. 1 is a schematic diagram illustrating a system in accordance with an embodiment of the present invention.

A semiconductor apparatus according to the present invention will be described below with reference to the accompanying drawings through exemplary embodiments. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and, in some instances, proportions may have been exaggerated in order to more clearly depict certain features of the invention. While particular terminology is used herein, it is to be appreciated that the terminology used herein is for the purpose of describing particular embodiments only and is not intended to limit the scope of the present invention.

FIG. 1 is a schematic diagram illustrating a system 10 in accordance with an embodiment of the present invention. Referring to FIG. 1, the system 10 may include a package substrate 110, an interposer 120, a controller 130, and a memory 140. The interposer 120 may be stacked over the package substrate 110, and may be electrically coupled with the package substrate 110 through an electrical coupling means 150 such as a bump ball, a ball grid array, a C4 bump, and so forth. A signal path may be formed for transfer of a signal on the interposer 120 and the package substrate 110. Although not illustrated, the package substrate 110 may include a package ball, and the system 10 may be coupled to an external electronic apparatus through the package ball.

The controller 130 and the memory 140 may be stacked over the interposer 120, and may be electrically coupled with the interposer 120 through a micro bump 160. The controller 130 may communicate with the memory 140 through the signal path formed on the interposer 120. The elements of the system 10 may be provided in a single package, and may be implemented as a system on chip (SOC), a system in package (SIP), a flip-chip package, and a multi-chip package.

The controller 130 may be a master device for controlling the memory 140. The controller 130 may include a central processing unit (CPU) a graphics processing unit (GPU), a digital signal processor (DSP), an application processor (AP), a controller chip, or a memory controller chip.

The memory 140 may be a slave device controlled by the controller 130. The memory 140 may be a volatile memory, such as a dynamic random access memory (DRAM) device. Also, the memory 140 may be a non-volatile memory such as a flash memory device, a phase change random access memory (PCRAM) device, a resistive random access memory (ReRAM) device, a ferroelectric random access memory (FeRAM) device, a magnetoresistive random access memory (MRAM) device, a spin transfer torque random access memory (STTRAM) device, and so forth. Also, the memory 140 may be implemented by combining two or more volatile and non-volatile memories. In an embodiment, the memory 140 may be a stack memory device having a plurality of stacked memory chips.

Figure 2:
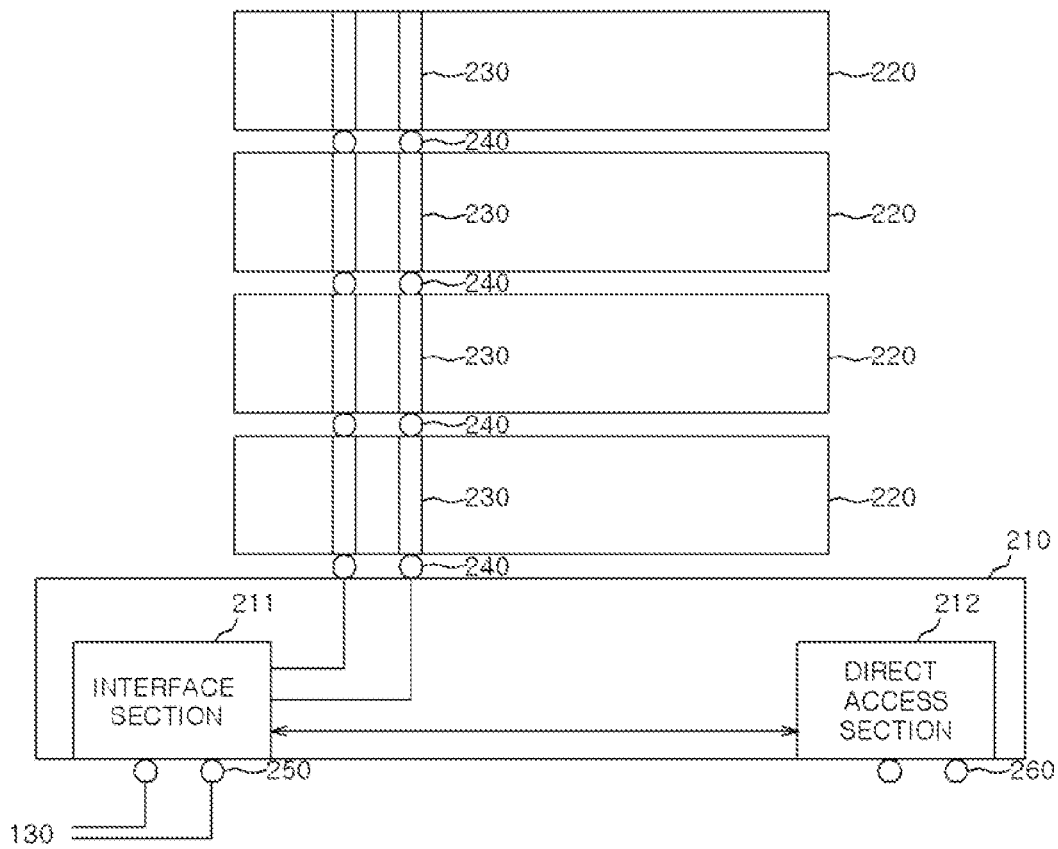
FIG. 2 is a schematic diagram illustrating a memory shown in FIG. 1.

FIG. 2 is a schematic diagram illustrating the memory 140 shown in FIG. 1. Referring to FIG. 2, the memory 140 may include a base die 210 and a plurality of stack dies 220. The plurality of stack dies 220 may be sequentially stacked over the base die 210. The plurality of stack dies 220 may include a through-via 230 formed therein, and may be electrically coupled to the base die 210 through a micro bump 240 and the through-via 230. The plurality of stack dies 220 may include a memory cell array for storing data.

The base die 210 may be electrically coupled to the controller 130 through the interposer 120 shown in FIG. 1. The base die 210 may transfer a control signal from the controller 130 to the plurality of stack dies 220, and may transfer data from the plurality of stack dies 220 to the controller 130. In an embodiment, the base die 210 may include circuits for controlling the plurality of stack dies 220, and, similar to the plurality of stack dies 220, may have a memory cell array for storing data.

The base die 210 may include an interface section 211 and a direct access section 212. The interface section 211 may be electrically coupled to the interposer 120 through a micro bump 250, and may be electrically coupled to the controller 130 through the signal path of the interposer 120. Therefore, the interface section 211 may receive a signal from the controller 130, and may transfer a signal from the memory 140 to the controller 130. Also, the interface section 211 may transform the signal received from the controller 130 into a signal suitable for being used in the memory 140, and may transform the signal received from the memory 140 into a signal suitable for being used in the controller 130. The micro bump 250 coupling the interface section 211 and the interposer 120 may be a normal bump or a normal pad.

The direct access section 212 may be electrically coupled to a direct access pad 260. In an embodiment, the direct access pad 260 may be a micro bump, a bump ball, a ball grid array, and so forth. The direct access pad 260 may be directly coupled to an external electronic device. The external electronic device may include a processor, other than a processor coupled to the controller 130, a memory controller, and a test device. The micro bump is so small that it is hard to couple an external electronic to the micro bump. Therefore, the direct access pad 260 may be electrically coupled to the external electronic device through an active interposer, when the direct access pad 260 is a micro bump. The active interposer may be a substrate temporally coupled to the base die 210 for a test of the memory 140 before the memory 140 is stacked over the interposer 120. The direct access section 212 may transfer a signal, which is transmitted through the direct access pad 260, to the interface section 211, and may output a signal, which is outputted through the interface section 211, to the external electronic device through the direct access pad 260. Therefore, the direct access section 212 may be electrically isolated/disconnected from the controller 130. The interface section 211 may receive a control signal for the operation of the memory 140 from the normal pad 250 and the direct access section 212. For example, the interface section 211 may receive the control signal from the controller 130 through the normal pad 250 when the memory 140 operates in a normal mode, and may receive the control signal through the direct access pad 260 and the direct access section 212 when the memory 140 operates in a test mode.

Figure 3:
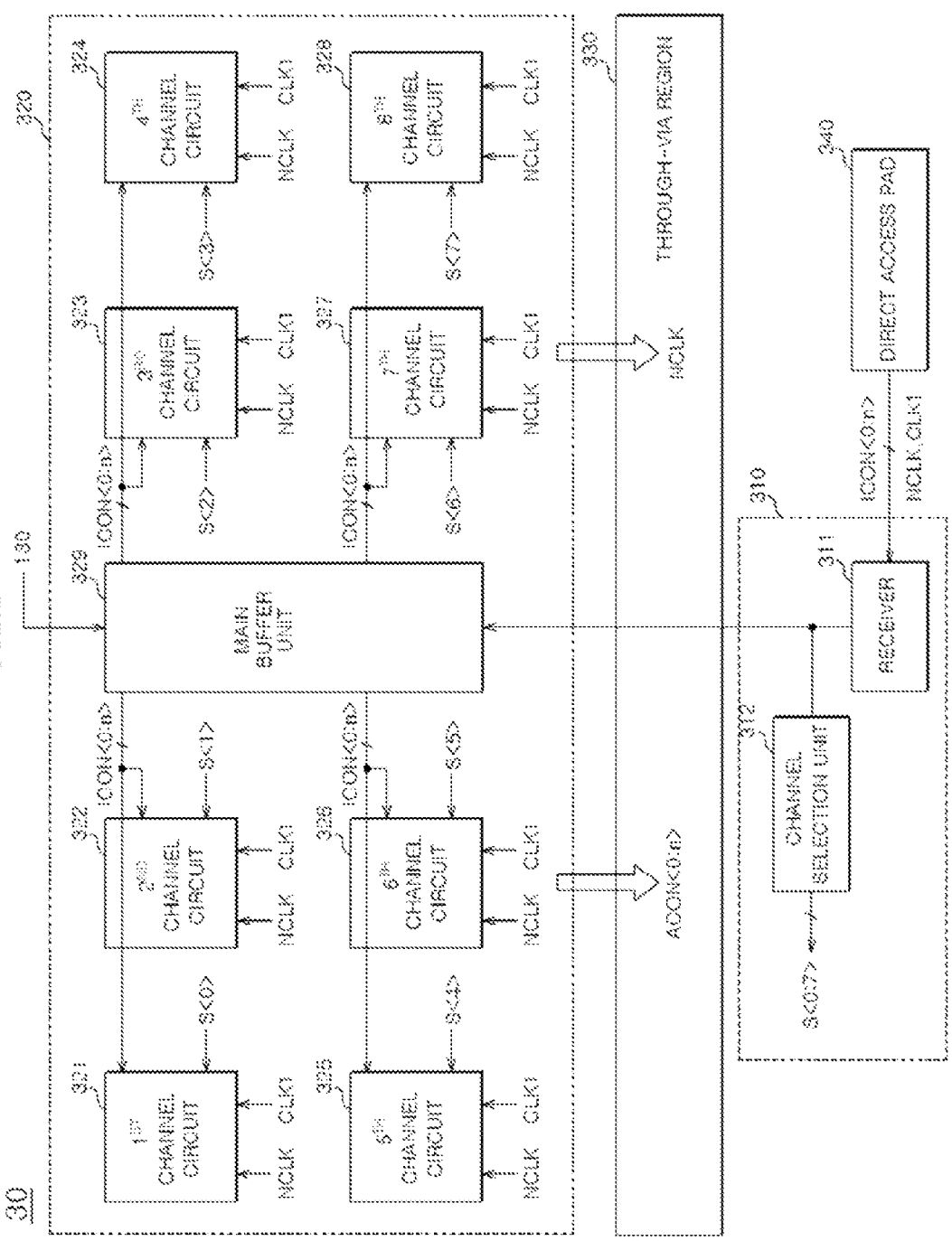
FIG. 3 is a block diagram illustrating a semiconductor apparatus in accordance with an embodiment of the present invention.

FIG. 3 is a block diagram illustrating a semiconductor apparatus 30 in accordance with an exemplary embodiment of the present invention. The semiconductor apparatus 30 may be applied to the memory 140 as the base die 210 described with reference to FIG. 2. The semiconductor apparatus 30 may include a direct access section 310, an interface section 320, and a through-via region 330. The direct access section 310 may receive a normal clock NCLK, a first clock CLK1, and a control signal ICON<0n> (n is a natural number) through a direct access pad 340. The direct access section 310 may buffer and output the normal clock NCLK, the first clock CLK1, and the control signal ICON<0:n>. The control signal ICON<0:n> may be aligned to the normal clock NCLK, and may be inputted through the direct access pad 340. The control signal ICON<0:n> may be a signal for controlling the memory 140, and may have information on operation of the memory 140. The direct access section 310 may generate a plurality of channel selection signals S<0:7> based on at least a part of the control signal ICON<0:n>.

The interface section 320 may receive a control signal for the operation of the memory 140 from the direct access section 310 and the controller 130. For example, the interface section 320 may receive the control signal for the operation of the memory 140 from the controller 130 when the memory 140 operates in the normal mode, and may receive the control signal for the operation of the memory 140 from the direct access section 310 when the memory 140 operates in the test mode. The interface section 320 may transfer the signal, which is transmitted from the controller 130 or the direct access section 310, to the plurality of stack dies 220 described with reference to FIG. 2. Referring to FIG. 3, the interface section 320 may be electrically coupled to the direct access section 310, and may receive the normal clock NCLK, the first clock CLK1, and the control signal ICON<0:n> from the direct access section 310.

In accordance with an exemplary embodiment of the present invention, there may be phase difference between the first clock CLK1 and the normal clock NCLK. Preferably, the phase difference between the first clock CLK1 and the normal clock NCLK may correspond to a half of a window, an active duration, or an eye pattern of the control signal ICON<0:n>.

The control signal ICON<0:n> may have multi bit information. The multi bit information may be consecutively inputted and centre-aligned to the rising edge and the falling edge of the norm al clock NCLK. Therefore, the control signal ICON<0:n> may have a window corresponding to a half of a period of the normal clock NCLK. The phase difference between the first clock CLK1 and the normal clock NCLK corresponds to a quarter of the period of the normal clock NCLK and thus there may be 90 degrees of the phase difference between the first clock CLK1 and the normal clock NCLK.

The interface section 320 may include a plurality of channel circuits 321 to 328. The plurality of channel circuits 321 to 328 may be provided to equal the number of the channels included in the memory 140. FIG. 3 exemplarily shows 8 channels included in the memory 140, and thus the interface section 320 may include first to eighth channel circuits 321 to 328. The plurality of channels, as an independent medium or part of the memory 140, may operate independently from one another to output and receive data. Each of the first to eighth channel circuits 321 to 328 may be electrically coupled to the corresponding one among the channels included in the memory 140. Each of the first to eighth channel circuits 321 to 328 may receive the normal clock NCLK, the first clock CLK1, and the control signal ICON<0:n>. Each of the first to eighth channel circuits 321 to 328 may be activated based on the corresponding one among the plurality of channel selection signals S<0:7>. When activated based on the corresponding one among the plurality of channel selection signals S<0:7>, each of the first to eighth channel circuits 321 to 328 may align the control signal ICON<0:n> to the first clock CLK1, and may output an aligned control signal ACON<0:n> to the corresponding one among the channels included in the memory 140 through the through-via region 330.

Referring to FIG. 2, the plurality of stack dies 220 may form the plurality of channels. For example, each of the plurality of stack dies 220 may form an individual channel. A part of each stack die 220 may form a channel and the rest part of the stack die 220 may form another channel. Each part of the stack die 220 may include a circuit for outputting and receiving data and a memory cell array for storing data among the elements of the stack die 220.

A plurality of through-vias may be disposed in the through-via region 330. The plurality of through-vias may electrically couple the semiconductor apparatus 30 and the plurality of stack dies 220, and may be signal paths for transferring signals, which are outputted form the interface section 320, to each of the plurality of stack dies 220.

Referring to FIG. 3, the direct access section 310 may include a receiver 311 and a channel selection unit 312. The receiver 311 may be electrically coupled to the direct access pad 340, and may receive the normal clock NCLK, the first clock CLK1, and the control signal ICON<0:n> from the direct access pad 340. The receiver 311 may buffer and output the normal clock NCLK, the first clock CLK1, and the control signal ICON<0:n> to the interface section 320. Although not illustrated, the receiver 311 may include a buffer circuit configured to buffer the normal clock NCLK, the first clock CLK1, and the control signal ICON<0:n>.

The channel selection unit 312 may generate the plurality of channel selection signals S<0:7> based on a part of the control signal ICON<0:n>. The control signal ICON<0:n> may include information for channel selection as well as information for the operation of the memory 140. The channel selection unit 312 may generate the plurality of channel selection signals S<0:7> by decoding at least a part of the control signal ICON<0:n>.

The interface section 320 may include the first to eighth channel circuits 321 to 328 and a main buffer unit 329. Each of the first to eighth channel circuits 321 to 328 may be electrically coupled to the main buffer unit 329 and the corresponding one of the channels included in the memory 140. As described above, the main buffer unit 329 may receive the control signal from the controller 130 or the control signal ICON<0:n> from the direct access pad 340, depending on the mode of the memory 140. The main buffer unit 329 may receive the normal clock. NCLK, the first clock CLK1, and the control signal ICON<0:n> from the direct access pad 340. The main buffer unit 329 may buffer and output the normal clock NCLK, the first clock CLK1, and the control signal ICON<0:n to the first to eighth channel circuits 321 to 328. In an exemplary embodiment, the plurality of channel selection signals S<0:7> generated by the channel selection unit 312 may be directly provided to the first to eighth channel circuits 321 to 328, respectively. Also, in an exemplary embodiment, the plurality of channel selection signals S<0:7> may be buffered by the main buffer unit 329, and may be outputted to the first to eighth channel circuits 321 to 328, respectively.

Each of the first to eighth channel circuits 321 to 328 may receive the normal clock NCLK, the first clock CLK1, and the control signal ICON<0:n> from the main buffer unit 329. Each of the first to eighth channel circuits 321 to 328 may be activated based on the corresponding one among the plurality of channel selection signals S<0:7>, When activated based on the corresponding one among the plurality of channel selection signals S<0:7> each of the first to eighth channel circuits 321 to 328 may generate the aligned control signal ACON<0:n> by aligning the control signal ICON<0:n> to the first clock CLK1. The first to eighth channel circuits 321 to 328 may be electrically coupled to first to eighth channels included in the memory 140, respectively. The first to eighth channel circuits 321 to 328 may be electrically coupled to the first to eighth channels through through-silicon vials of the through--silicon via region 330. Each of the first to eighth channel circuits 321 to 328 may transmit the aligned control signal ACON<0:n> and the normal clock NCLK to the corresponding one among the first to eighth channels included in the memory 140. The first to eighth channels included in the memory 140 may operate based on the aligned control signal ACON<0:n>.

The control signal ICON<0:n> inputted through the direct access pad 340 may be buffered by the receiver 311 and may be inputted to each of the first to eighth channel circuits 321 to 328 through relatively long signal lines. Therefore, skew or phase variation may occur in the control signal ICON<0:n>, and deterioration of setup and hold time margins may occur in the control signal ICON<0:n>. Thus, the first to eighth channel circuits 321 to 328 may improve the setup and hold time margins of the control signal ICON<0:n> by re-aligning the control signal ICON<0:n> to the first clock CLK1, which has a phase difference from the normal clock NCLK.

Figure 4:
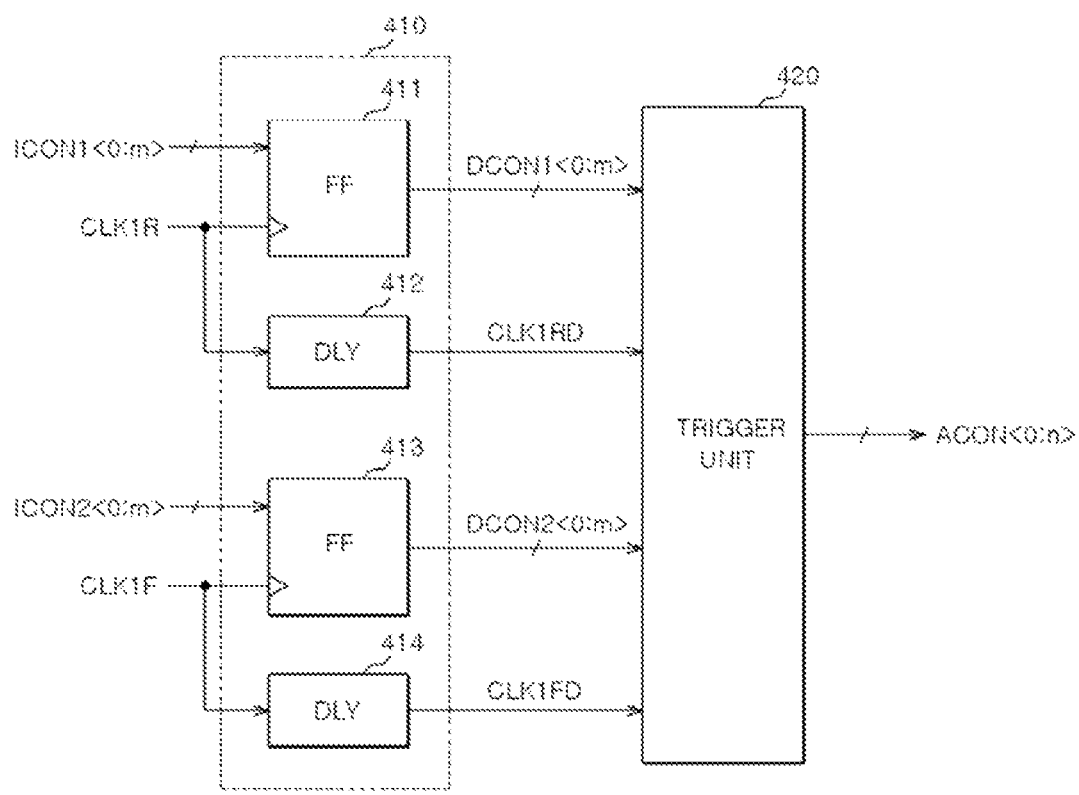
FIG. 4 is a block diagram illustrating a first channel circuit shown in FIG. 3.

FIG. 4 is a block diagram illustrating a first channel circuit 321 among the first to eighth channel circuits 321 to 328 shown in FIG. 3. FIG. 4 shows a part of the first channel circuit 321. Each of the second to eighth channel circuits 322 to 328 may be the same as the first channel circuit 321. The first channel circuit 321 may receive the first clock CLK1 and the control signal ICON<0:n>, and may generate the aligned control signal ACON<0:n> by synchronizing the control signal ICON<0:n> to the first clock CLK1. A part ICON1<0:n> of the control signal ICON<0:>, wherein m is a half of n, may be synchronized to the rising edge of the first clock CLK1, and the rest part ICON2<0:m> of the control signal ICON<0:n> may be synchronized to the falling edge of the first clock CLK1.

Referring to FIG. 4, the first channel circuit 321 may include a control signal alignment unit 410, and a trigger unit 420. The control signal alignment unit 410 may include a plurality of flip-flops, and a plurality of delay parts. The first flip-flop 411 may receive the part ICON1<0:m> of the control signal ICON<0:n> and a rising clock CLK1R of the first clock CLK1. The part ICON1<0:m> of the control signal ICON<0:n> may be centre-aligned to the rising edge of the normal clock NCLK. The rising clock CLK1R of the first clock CLK1 may have the same phase as the first clock CLK1. The first flip-flop 411 may output a first delay control signal DCON1<0:m> by synchronizing the part ICON1<0:m> of the control signal ICON<0:n> to the rising clock CLK1R of the first clock CLK1. The first delay part 412 may output a first delay clock CLK1RD by delaying the rising clock CLK1R of the first clock CLK1. The second flip-flop 413 may receive the rest part ICON2<0:m> of the control signal ICON<0:n> and a falling clock CLK1F of the first clock CLK1. The rest part ICON2<0:m> of the control signal ICON<0:n> may be centre-aligned to the falling edge of the normal clock NCLK. The falling clock CLK1F of the first clock CLK1 may be a differential clock having 180 degrees io of phase difference from the first clock CLK1, and may be generated by inverting the first clock CLK1. The second flip-flop 413 may output a second delay control signal DCON2<0:m> by synchronizing the rest part ICON2<0:m> of the control signal ICON<0:n> to the falling clock CLK1F of the first clock CLK1. The second delay part 414 may output a second delay clock CLK1FD by delaying the falling clock CLK1F of the first clock CLK1.

The trigger unit 420 may receive the first and second delay control signals DCON1<0:m> and DCON2<0:m>, and the first and second delay clocks CLK1RD and CLK1FD. The trigger unit 420 may output the first delay control signal DCON1<0:m> at the rising edge of the first delay clock CLK1RD, and may output the second delay control signal DCON2<0:m> at the rising edge of the second delay clock CLK1FD. An output signal of the trigger unit 420 may be the aligned control signal ACON<0:n>, and may be transferred to internal circuit of the first channel coupled to the trigger unit 420 through the through-silicon via region 330.

Figure 5:
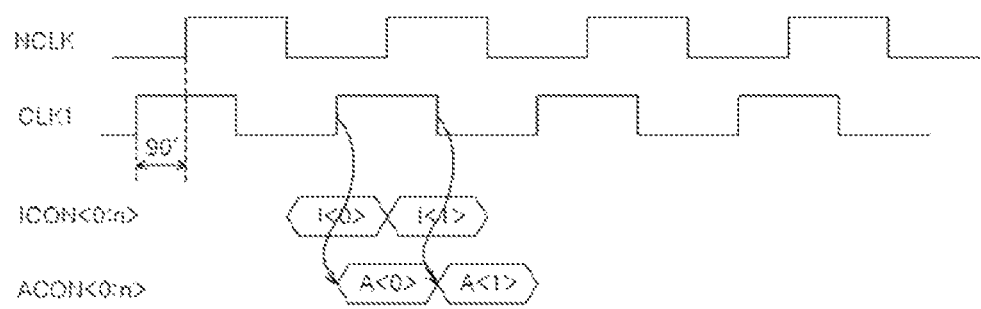
FIG. 5 is a timing diagram illustrating an operation of a semiconductor apparatus in accordance with an embodiment of the present invention.

FIG. 5 is a timing diagram illustrating an operation of the semiconductor apparatus 30 in accordance with an exemplary embodiment of the present invention. The operation of the semiconductor apparatus 30 will be described with reference to FIGS. 3 to 5. The control signal ICON<0:n> may be inputted through the direct access pad 340 and may be transmitted to each of the first to eighth channel circuits 321 to 328 through the receiver 311 and the main buffer unit 329. FIG. 5 shows a situation where the control signal ICON<0:n>, or I<0> and I<1>, is inputted being centre-aligned to the rising and falling edges of the normal clock NCLK, and skew or phase variation occurs to the control signal I<0> and I<1> during transmission through the signal path. When the first channel circuit 321 is activated in response to the channel selection signal S<0>, the first channel circuit 321 may re-align the control signal I<0> and I<1> by synchronizing the control signal I<0> and I<1> to the rising and falling edges of the first clock CLK1. The control signal I<0> and I<1> may be re-aligned to the first clock CLK1 having 90 degrees of the phase difference from the normal clock NCLK, and therefore the aligned control signal ACON<0:n>, or A<0> and A<1>, may be centre-aligned to the rising and falling edges of the normal clock NCLK, and the setup and hold time margins may be improved.

Figure 6:
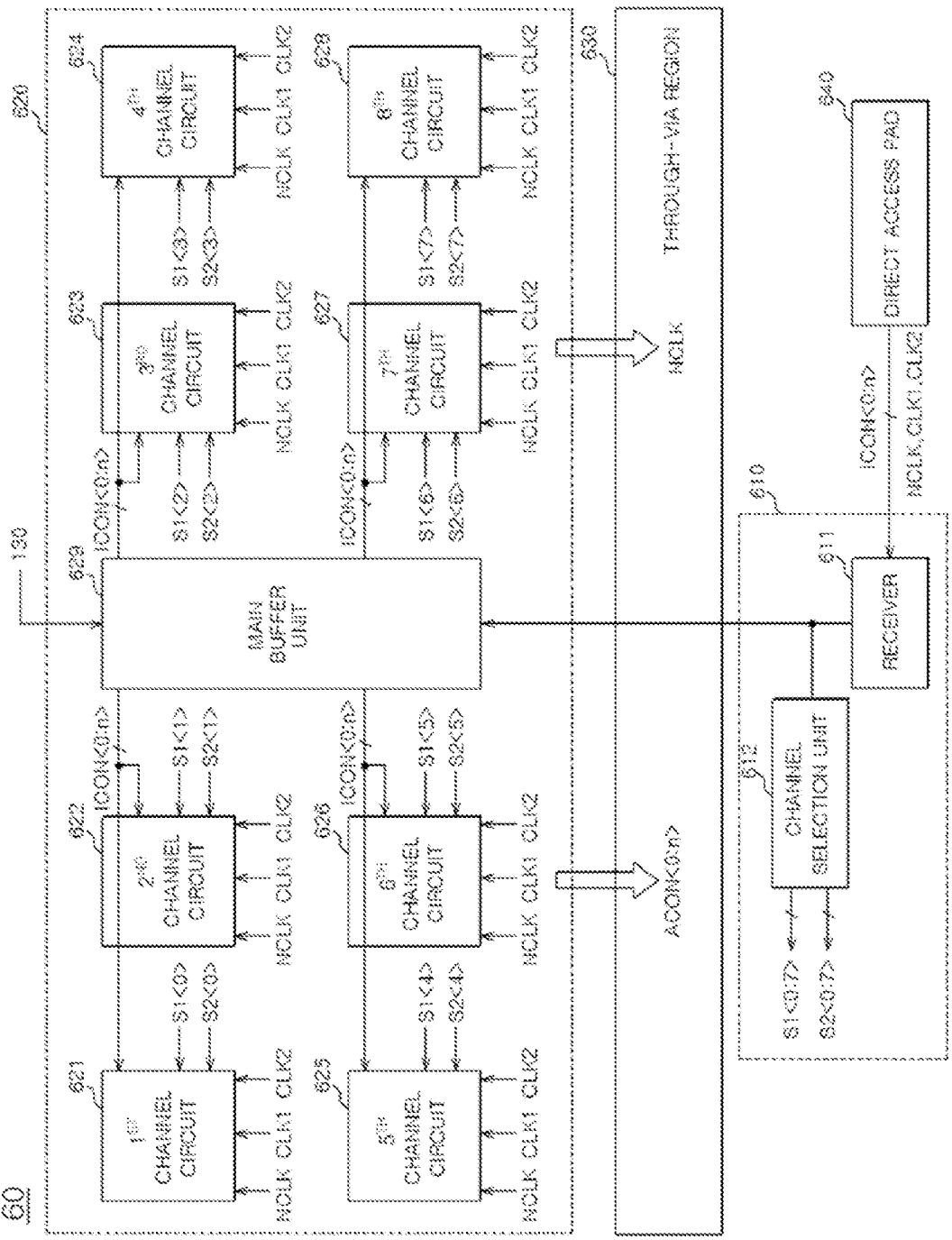
FIG. 6 is a block diagram illustrating a semiconductor apparatus in accordance with an embodiment of the present invention.

FIG. 6 is a block diagram illustrating a semiconductor apparatus 60 in accordance with an exemplary embodiment of the present invention. The semiconductor apparatus 60 may be applied to the memory 140 as the base die 210 described with reference to FIG. 2. The semiconductor apparatus 60 may include a direct access section 610, an interface section 620, and a through-via region 630. The direct access section 610, the interface section 620, and the through-via region 630 may be the same as the direct access section 310, the interface section 320, and the through-via region 330, described with reference to FIG. 3, respectively. Hereinafter, the semiconductor apparatus 60 will be described with focus on the differences from the semiconductor apparatus 30 described with reference to FIGS. 3 to 5. The direct access section 610 may receive a normal clock NCLK, a first clock CLK1, a second clock CLK2, and a control signal ICON<0:n>. The first clock CLK1 may have 90 degrees of the phase difference from the normal clock NCLK. In accordance with an exemplary embodiment of the present invention, the second clock CLK2 may have a phase difference less than or equal to 90 degrees from the first clock CLK1. The phase difference between the first clock CLK1 and the second clock CLK2 may be variable within 90 degrees. The direct access section 610 may provide the normal clock NCLK, the first dock CLK1, the second clock CLK2, and the control signal ICON<0:n> to the interface section 620, and may generate a plurality of channel selection signals S1<0:7> and S2<0:7> based on a part of the control signal ICON <0:n>. Each of the plurality of channel selection signals S1<0:7> and S2<0:7> may be inputted to a corresponding channel circuit.

The direct access section 610 may include a receiver 611 and a channel selection unit 612. The receiver 611 may buffer and output the normal clock NCLK, the first clock CLK1, the second clock CLK2, and the control signal ICON<0:n> to the interface section 620. The channel selection unit 612 may generate the plurality of channel selection signals S1<0:7> and S2<0:7> based on the part of the control signal ICON<0:n> outputted from the receiver 611. The channel selection unit 612 may generate two or more groups of the channel selection signals. The number of each group of the channel selection signals may correspond to the number of channels included in the memory 140. Therefore, the channel selection unit 612 may provide two or more channel selection signals to each of the channel circuits.

The interface section 620 may include first to eighth channel circuits 621 to 628 and a main buffer unit 629. The main buffer unit 629 may receive the normal clock NCLK, the first clock CLK1, the second clock CLK2, and the control signal ICON<0:n> from the receiver 611 of the direct access section 610. The main buffer unit 629 may provide the normal clock NCLK, the first clock CLK1, the ut second clock CLK2, and the control signal ICON <0:n> to the first to eighth channel circuits 621 to 628. Each of the first to eighth channel circuits 621 to 628 may receive the normal clock NCLK, the first clock CLK1, the second clock CLK2, and the control signal ICON<0:n> as well as assigned ones among the plurality of channel selection signals S1<0:7> and S2<0:7>. Each of the first to eighth channel circuits 621 to 628 may align the control signal ICON<0:n> to one of the first and second clocks CLK1 and CLK2 in response to the assigned ones among the plurality of channel selection signals S1<0:7> and S2<0:7>, Each of the channels included in the memory 140 may perform operations by receiving signals from the corresponding one of the first to eighth channel circuits 621 to 628.

Each of the first to eighth channel circuits 621 to 628 may monitor characteristics of the corresponding one of the channels included in the memory 140 since each of the first to eighth channel circuits 621 to 628 may select one of the first and second clocks CLK1 and CLK2, and may align the control signal ICON<0:n> to the selected one of the first and second clocks CLK1 and CLK2. For example, when the second to eighth channel circuits 622 to 628 re-align the control signal ICON<0:n> to the first clock CLK1 in response to the plurality of channel selection signals S1<1:7>, and the first channel circuit 621 re-aligns the control signal ICON<0:n> to the second clock CLK2 in response to the channel selection signal S2<0>, the phase, setup and hold time margins of the control signal outputted from the second to eighth channel circuits 622 to 628 may be compared with the phase, setup and hold time margins of the control signal outputted from the first channel circuit 621. Therefore, the characteristics of the first channel circuit 621 and all signal paths coupled to the first channel circuit 621 may be compared with the characteristics of the second to eighth channel circuits 622 to 628 and all signal paths coupled to the second to eighth channel circuits 622 to 628, and the characteristics of a specific channel circuit and signal paths coupled to the specific channel circuit can be independently monitored.

Figure 7:
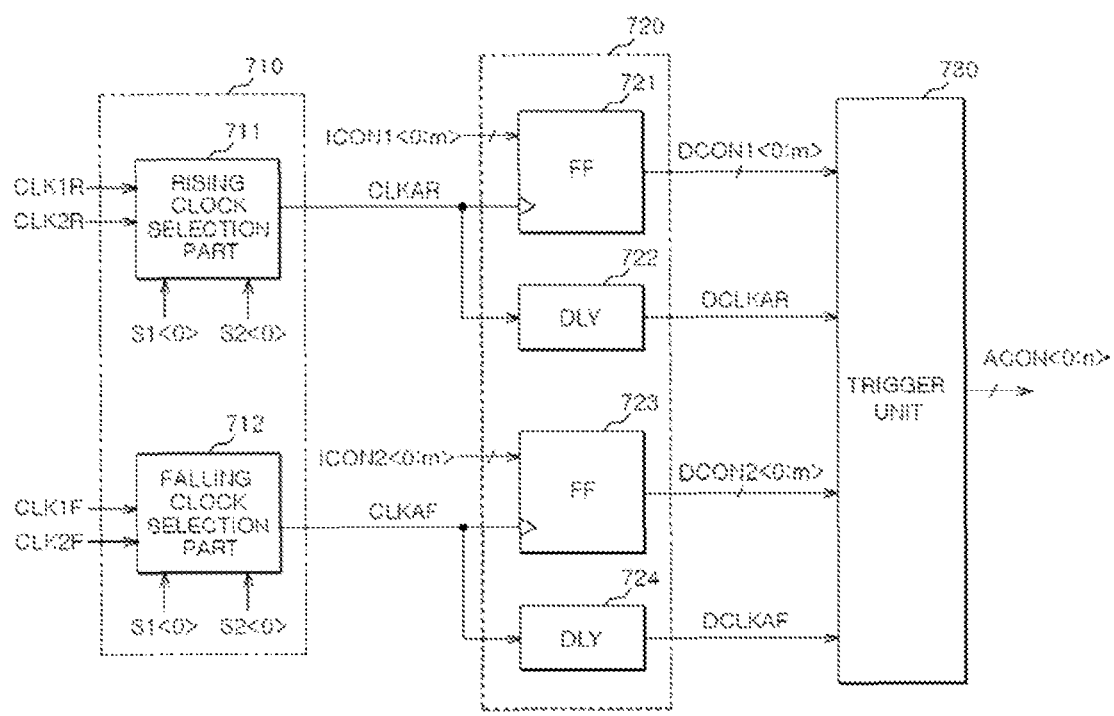
FIG. 7 is a block diagram illustrating a first channel circuit shown in FIG. 6.

FIG. 7 is a block diagram illustrating the first channel circuit 621 among the first to eighth channel circuits 621 to 628 shown in FIG. 6. FIG. 7 may show a part of the first channel circuit 621. Each of the second to eighth channel circuits 622 to 628 may be the same as the first channel circuit 621. Referring to FIG. 7, the first channel circuit 621 may include a clock selection unit 710, a control signal alignment unit 720 and a trigger unit 730. The clock selection unit 710 may select one of the first and second docks CLK1 and CLK2 in response to the channel selection signals S1<0> and S2<0> assigned to the first channel circuit 621 among the plurality of channel selection signals S1<0:7> and S2<0:7>. The clock selection unit 710 may include a rising clock selection part 711 and a falling clock selection part 712. The rising clock selection part 711 may receive a rising clock CLK1R of the first clock CLK1, a rising clock CLK2R of the second clock CLK2, and the first and second channel selection signals S1<0> and S2<0>. The rising clock CLK1R of the first clock CLK1 may have the same phase as the first clock CLK1. The rising clock CLK2R of the second clock CLK2 may have the same phase as the second clock CLK2. The first and second channel selection signals S1<0> and S2<0> may represent the channel selection signal assigned to the first channel circuit 621. For example, the rising clock selection part 711 may output the rising clock CLK1R of the first dock CLK1 as a rising alignment dock CLKAR when the first channel selection signal S1<0> is enabled, and may output the rising clock CLK2R of the second clock CLK2 as the rising alignment clock CLKAR when the second channel selection signal S2<0> is enabled.

The falling clock selection part 712 may receive a falling clock CLK1F of the first clock CLK1, a falling clock CLK2F of the second clock CLK2, and the first and second channel selection signals S1<0> and S2<0>. The falling clock CLK1F of the first clock CLK1 may be a differential clock having 180 degrees of the phase difference from the first clock CLK1. The falling clock CLK2F of the second clock CLK2 may be a differential clock having 180 degrees of the phase difference from the second clock CLK2. The falling clock selection part 712 may output the falling clock CLK1F of the first clock CLK1 as a falling alignment clock CLKAF when the first channel selection signal S1<0> is enabled, and may output the falling clock CLK2F of the second clock CLK2 as the falling alignment clock CLKAF when the second channel selection signal S2<0> is enabled.

The control signal alignment unit 720 may receive the control signal ICON<0:n> and synchronize a part ICON1<0:m> of the control signal ICON<0:n> to the rising alignment clock CLKAR. Also, the control signal alignment unit 720 may synchronize the rest part ICON2<0:m> of the control signal ICON<0:n> to the falling alignment clock CLKAF. Therefore, the control signal alignment unit 720 may synchronize the part ICON1<0:m> of the control signal ICON<0:n> to the rising edge of one of the first and second clocks CLK1 and CLK2. Also, the control signal alignment unit 720 may synchronize the rest part ICON2<0:m> of the control signal ICON<0:n> to the falling edge of one of the first and second clocks CLK1 and CLK2. The control signal alignment unit 720 may include a plurality of flip-flops, and a plurality of delay parts. The first flip-flop 721 may receive the part ICON1<0:m> of the control signal ICON<0:n> and the rising alignment clock CLKAR, and may output a first delay control signal DCON1<0:m> by synchronizing the part ICON1<0:n> of the control signal ICON<0:n> to the rising alignment clock CLKAR. The first delay part 722 may output a rising delay clock DCLKAR by delaying the rising alignment clock CLKAR. The second flip-flop 723 may receive the rest part. ICON2<0:m> of the control signal ICON<0:n> and the falling alignment clock CLKAF, and may output a second delay control signal DCON2<0:m> by synchronizing the rest part ICON2<0:m> of the control signal ICON<0:n> to the falling alignment clock CLKAF. The second delay part 724 may output a falling delay clock DCLKAF by delaying the falling alignment clock CLKAF.

The trigger unit 730 may receive the first and second delay control signals DCON1<0:m> and DCON2<0:m>, the rising delay clock DCLKAR, and the falling delay clock DCLKAF from the control signal alignment unit 720. The trigger unit 730 may synchronize the first delay control signal DCON1<0:m>, which is outputted from the first flip-flop 721, to the rising edge of the rising delay clock DCLKAR. Also, the trigger unit 730 may synchronize the second delay control signal DCON2<0:m>, which is outputted from the second flip-flop 723, to the rising edge of the falling delay clock DCLKAF. The aligned control signal ACON<0:n> outputted from the trigger unit 730 may be transferred to the first channel coupled to the first channel circuit 621.

Figure 8:
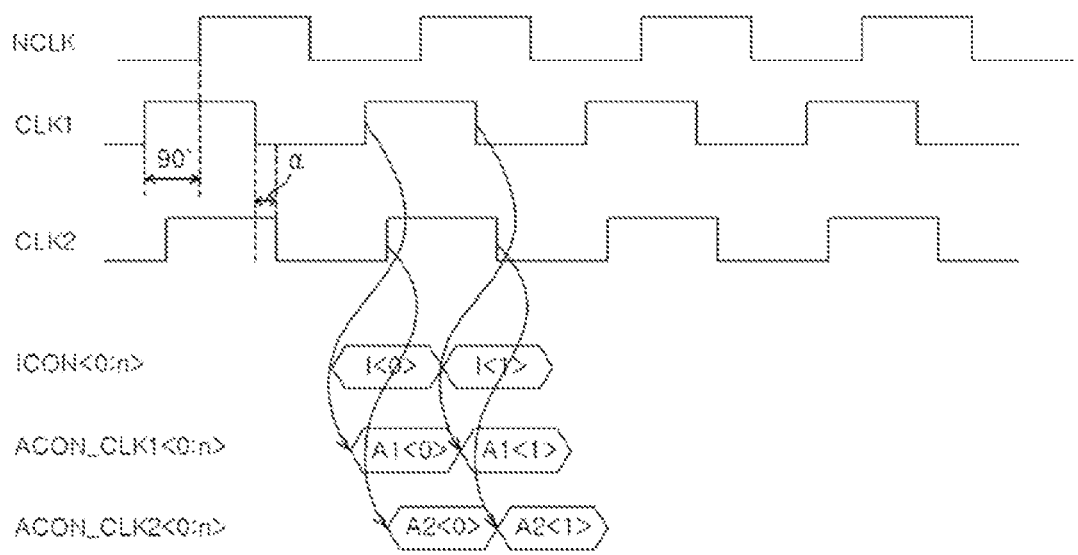
FIG. 8 is a timing diagram illustrating an operation of a semiconductor apparatus in accordance with an embodiment of the present invention.

FIG. 8 is a timing diagram illustrating an operation of the semiconductor apparatus 60 in accordance with an exemplary embodiment of the present invention. The operation of the semiconductor apparatus 60 will be described with reference to FIGS. 6 to 8. The control signal ICON<0:n> may be inputted through the direct access pad 640, and may be transmitted to each of the first to eighth channel circuits 621 to 628 through the receiver 611 and the main buffer unit 629. FIG. 8 shows a situation in which the control signal ICON<0:n>, or I<0> and I<1>, is inputted being centre-aligned to the rising and falling edges of the normal clock NCLK, and skew or phase variation occurs to the control signal I<0> and I<1> during transmission through the signal path. Each of the second to eighth channel circuits 622 to 628 may synchronize the control signal I<0> and I<1> to the rising and falling edges of the first clock CLK1, and may output a first aligned control signal ACON CLK1<0:n>, or A1<0> and A1<1>, in response to the assigned one of the plurality of channel selection signals S1<0:7>. The first channel circuit 621 may synchronize the control signal I<0> and I<1> to the rising and falling edges of the second clock CLK2, and may output a second aligned control signal ACON_CLK2<0:n>, or A2<0> and A2<1>, response to the channel selection signal S2<0>. Referring to FIG. 8, the first aligned control signal ACON_CLK1<0:n> is the control signal synchronized and aligned to the first clock CLK1. Also, the second aligned control signal ACON_CLK2 0:n> is the control signal synchronized and aligned to the second clock CLK2. Therefore, the phase difference (α) between the second aligned control signal ACON_CLK2<0:n> outputted from the first channels circuit 621 and the first aligned control signal ACON_CLK1<0:n> outputted from the second to eighth channel circuits 622 to 628 may ideally be the same as between the first clock CLK1 and the second clock CLK. When the phase difference (α) between the second aligned control signal ACON_CLK2<0:n>, outputted from the first channels circuit 621, and the first aligned control signal ACON_CLK1<0:n>, outputted from the second to eighth channel circuits 622 to 628, is different from the phase difference between the first clock CLK1 and the second clock CLK2, the characteristics of the first channel circuit 621 and all signal paths coupled to the first channel circuit 621 may be monitored as being fast or slow. Also, the setup and hold time margins of the control signal outputted from each of the first to eighth channel circuits 621 to 628 may be monitored in detail by varying the phase difference between the first and second clocks CLK1 and CLK2.

While certain embodiments have been described above, will be understood to those skilled in the art that the embodiments described are examples only. Accordingly, the semiconductor apparatus and system including a plurality of channels should not be limited based on the described embodiments. Rather, the semiconductor apparatus and system including a plurality of channels described herein should only be limited in light of the claims that follow when taken in conjunction with the above description and accompanying drawings.

What is claimed is:

1. A semiconductor apparatus comprising:
    a direct access section suitable for receiving a normal clock, a first clock, and a control signal through a direct access pad;
    an interface section comprising a plurality of channel circuits suitable for aligning the control signal to the first clock, and outputting an aligned control signal; and
    a through-via region suitable for transferring the normal clock and the aligned control signal from the interface section to a plurality of channels corresponding to the respective channel circuits.

2. The semiconductor apparatus of claim 1, wherein the first: clock has 90 degrees of phase difference from the normal clock.

3. The semiconductor apparatus of claim 1, wherein the control signal is center-aligned to the normal clock, and is inputted to the direct access section.

4. The semiconductor apparatus of claim 1, wherein each of the plurality of channel circuits transmits the normal clock and the aligned control signal to a corresponding channel of the plurality of channels when the channel circuit is activated in response to a channel selection signal assigned to the channel circuit.

5. The semiconductor apparatus of claim 1, wherein the interface section further comprises:
    a main buffer suitable for buffering the normal clock, the first clock, and the control signal and outputting buffered signals to each of the plurality of channel circuits.

6. The semiconductor apparatus of claim 1, wherein the direct access section comprises:
    a receiver suitable for receiving the control signal from he direct access pad and buffering the control signal; and
    a channel selection unit suitable for generating a channel selection signal for activating the plurality of channel circuits based on a part of the control signal.

7. The semiconductor apparatus of claim 1,
    wherein each of the plurality of channel circuits synchronizes a part of the control signal to a rising edge of the first clock, and outputs a synchronized part of the control signal, and
    wherein each of the plurality of channel circuits synchronizes the remaining part of the control signal to a falling edge of the first clock, and outputs a synchronized rest part of the control signal.

8. A semiconductor apparatus comprising:
    a direct access section suitable for receiving a normal clock, a first clock, a second clock, and a control signal through a direct access pad;
    an interface section comprising a plurality of channel circuits suitable for aligning the control signal to one of the first clock and the second clock, and outputting an aligned control signal in response to a channel selection signal assigned thereto; and
    a through-via region suitable for transferring the normal clock and the aligned control signal from the interface section to a plurality of channels corresponding to the respective channel circuits.

9. The semiconductor apparatus of claim 8,
    wherein the first clock has 90 degrees of phase difference from the normal clock, and
    wherein the second clock has a phase difference equal to or smaller than 90 degrees from the first clock.

10. The semiconductor apparatus of claim 8, wherein the control signal is center-aligned to the normal clock, and is inputted to the direct access section.

11. The semiconductor apparatus of claim 8, wherein each of the plurality of channel circuits receives first and second channel selection signals assigned to the channel circuit, synchronizes the control signal to the first clock when the first channel selection signal is enabled, and synchronizes the control signal to the second clock when the second channel selection signal is enabled.

12. The semiconductor apparatus of claim 8, wherein the interface section further comprises:
    a main buffer suitable for buffering the normal clock, the first clock, the second clock, and the control signal and outputting buffered signals to each of the plurality of channel circuits.

13. The semiconductor apparatus of claim 8, therein the direct access section comprises:
    a receiver suitable for receiving the control signal from the direct access pad and buffering the control signal; and
    a channel selection unit suitable for generating a plurality of channel selection signals in response to a part of the control signal.

14. The semiconductor apparatus of claim 13, wherein the channel selection unit generates two or more groups of channel selection signals, and provides two or more channel selection signals to each of the plurality of channel circuits.

15. The semiconductor apparatus of claim 8,
    wherein each of the plurality of channel circuits synchronizes a part of the control signal to a rising edge of one of the first and second clocks, and outputs a synchronized part of the control signal in response to the channel selection signal assigned to the channel circuit, and
    wherein each of the plurality of channel circuits synchronizes the remaining part of the control signal to a falling edge of one of the first and second clocks, and outputs a synchronized rest part of the control signal in response to the channel selection signal assigned to the channel circuit.

16. The semiconductor apparatus of claim 15, wherein each of the plurality of channel circuits comprises:
- a clock selection unit suitable for selecting one of the first and second clocks in response to the channel selection signal assigned to the channel circuit;
- a control signal alignment unit suitable for synchronizing the control signal to one of the first and second clocks selected by the clock selection part, and outputting a synchronized control signal; and
- a trigger unit suitable for generating the aligned control signal by synchronizing the synchronized control signal to one of the first and second clocks selected by the clock selection part.

17. A semiconductor apparatus comprising:
- a direct access section suitable for receiving first and second clocks having a phase difference from each other, and a control signal synchronized to the first clock; and
- an interface section comprising a plurality of channel circuits suitable for aligning the control signal to the second clock based on a plurality of channel selection signals, respectively,
- wherein the interface section transfers the first clock and an aligned control signal to a plurality of channels corresponding to the respective channel circuits through a through-via region.

18. The semiconductor apparatus of claim 17, wherein when the control signal is center-aligned to the first clock, the phase difference between the first and second clocks corresponds to a half of a an eye pattern of the control signal.

* * * * *